US008907469B2

(12) United States Patent
Chen

(10) Patent No.: US 8,907,469 B2
(45) Date of Patent: Dec. 9, 2014

(54) INTEGRATED CIRCUIT PACKAGE ASSEMBLY AND METHOD OF FORMING THE SAME

(75) Inventor: Hsien-Wei Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 213 days.

(21) Appl. No.: 13/353,644

(22) Filed: Jan. 19, 2012

(65) Prior Publication Data

US 2013/0187266 A1 Jul. 25, 2013

(51) Int. Cl.
*H01L 23/48* (2006.01)

(52) U.S. Cl.
USPC ............. 257/693; 438/109; 257/E23.068; 257/E21.499

(58) Field of Classification Search
None
See application file for complete search history.

(56) References Cited

U.S. PATENT DOCUMENTS

| | | | | |
|---|---|---|---|---|
| 6,847,105 | B2* | 1/2005 | Koopmans | 257/686 |
| 2006/0249852 | A1* | 11/2006 | Chiu et al. | 257/778 |
| 2007/0289127 | A1* | 12/2007 | Hurwitz et al. | 29/827 |
| 2009/0057864 | A1* | 3/2009 | Choi et al. | 257/686 |
| 2012/0074589 | A1* | 3/2012 | Mardi et al. | 257/777 |
| 2012/0161315 | A1* | 6/2012 | Lin et al. | 257/738 |

* cited by examiner

*Primary Examiner* — Sonya D McCall Shepard
(74) *Attorney, Agent, or Firm* — Lowe Hauptman & Ham, LLP

(57) ABSTRACT

An integrated circuit package assembly includes a first integrated circuit package and a second integrated circuit package disposed under the first integrated circuit package. Solder bumps are disposed between the first integrated circuit package and the second integrated circuit package providing electrical signal connections between the first integrated circuit package and the second integrated circuit package. At least one support structure is disposed between the first integrated circuit package and the second integrated circuit package to facilitate thermal conduction between the first integrated circuit package and the second integrated circuit package without providing electrical signal connections.

20 Claims, 7 Drawing Sheets

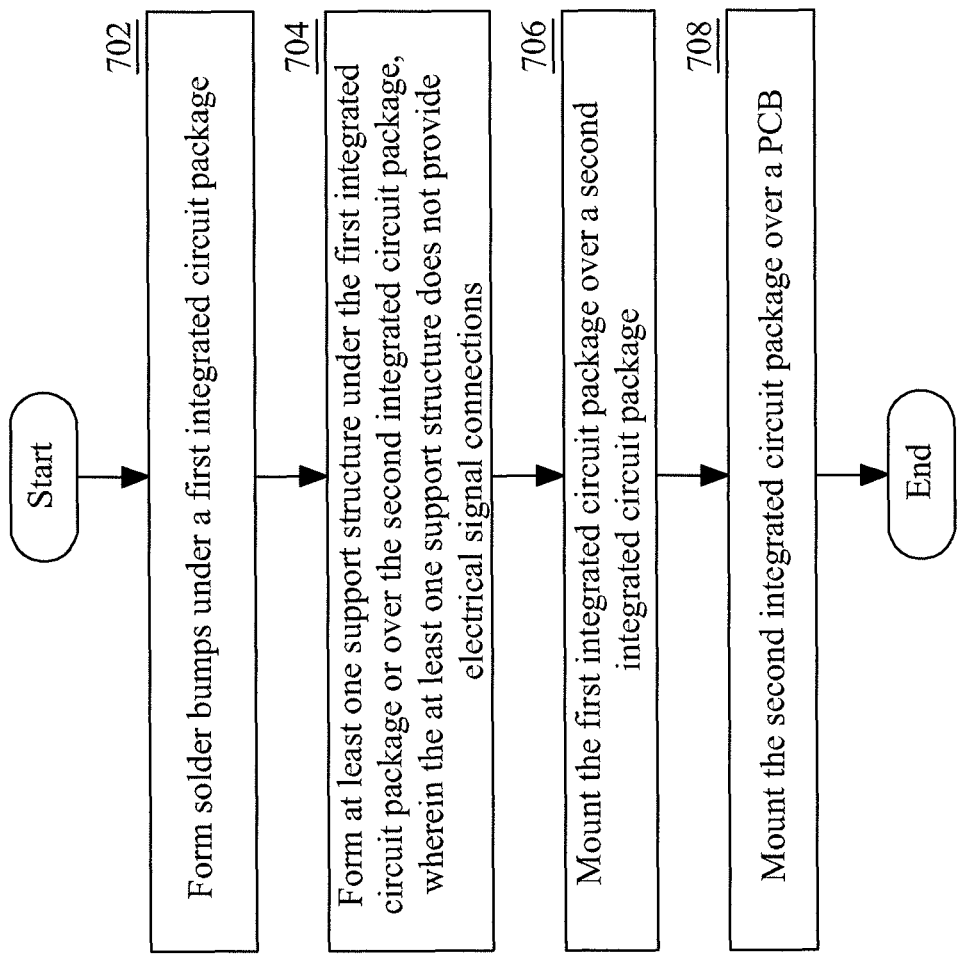

INTEGRATED CIRCUIT PACKAGE ASSEMBLY AND METHOD OF FORMING THE SAME

TECHNICAL FIELD

The present disclosure relates generally to an integrated circuit package and more particularly a package-on-package (POP).

BACKGROUND

Package on Package (POP) is an integrated circuit packaging technique to allow vertically combining multiple packages, e.g., discrete logic and memory ball grid array (BGA) packages. Two or more packages are mounted on top of one another, i.e. stacked, with an electrical interface to route electrical signals between them. This allows higher density integrated circuit chips usable in mobile devices, for example in mobile telephones or Personal digital assistants (PDA). However, due to different materials used in the combined multiple packages, the POP structure may have thermal (heat) related issues such as heat dissipation or mismatched thermal expansion coefficients.

BRIEF DESCRIPTION OF THE DRAWINGS

Reference is now made to the following descriptions taken in conjunction with the accompanying drawings, in which:

FIG. 7 is a flowchart of an exemplary method of fabricating a POP assembly according to some embodiments.

DETAILED DESCRIPTION

Figure 1:
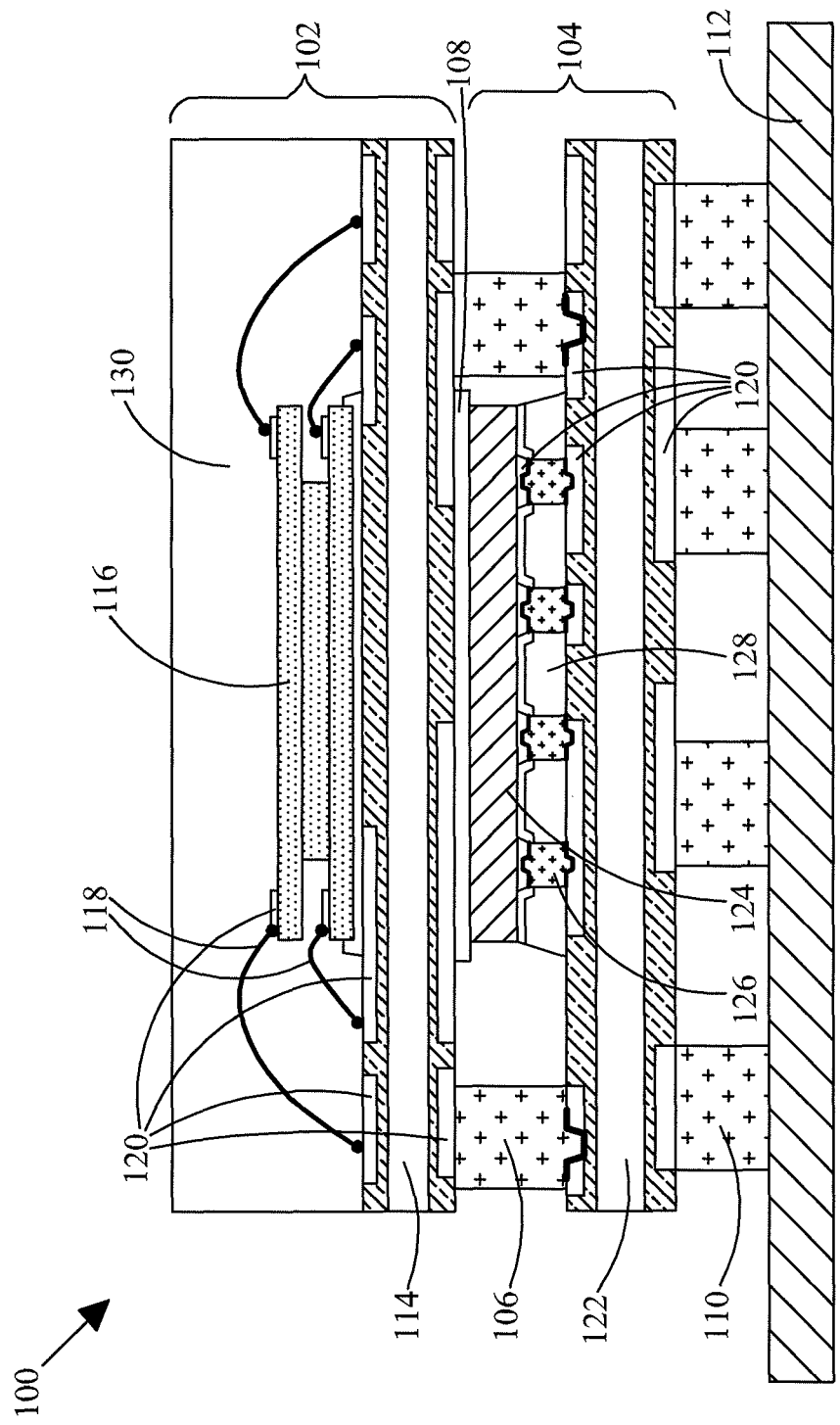
FIG. 1 is a schematic diagram of an exemplary package-on-package (POP) assembly according to some embodiments.

The making and using of various embodiments are discussed in detail below. It should be appreciated, however, that the present disclosure provides many applicable inventive concepts that can be embodied in a wide variety of specific contexts. The specific embodiments discussed are illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary package-on-package (POP) assembly 100 according to some embodiments. The POP assembly 100 includes a top integrated circuit package ("top package") 102, a bottom integrated circuit package ("bottom package") 104, solder bumps (solder balls) 106 and 110 for ball grid array (BGA) packaging, a buffer layer 108, and a printed circuit board (PCB) 112. (The solder bumps 106 and 110 are not considered part of the bottom package 104.) The top package 102 includes a top integrated circuit die ("top die") 116 (flip chip package in this example), bond wires 118 to electrically connect the top die 116 to a top substrate 114 using some pads 120 on the top substrate 114. Molding compound 130 encapsulate the top die 116 and bond wires 118. Bond wires 118 and pads 120 can comprise aluminium, copper, gold, or any other suitable electrically conductive material.

The bottom package 104 includes a bottom die 124 mounted on a bottom substrate 122 with micro bumps (such as a Controlled Collapse Chip Connection bump or sometimes also referred to as a C4 bumps) 126 for electrical connection. Underfill 128 (e.g., epoxy mixture) fills the gap between the bottom die 124 and the bottom substrate 122. The bottom substrate 122 is mounted on the PCB 112 with solder bumps 110 for electrical connection. Some pads 120 provide electrical contact surfaces for solder bumps 106 and 110.

The solder bumps 106 and 110 provide electrical signal connections between the top package 102 and the bottom package 104, or between the bottom package 104 and the PCB 112. The solder bumps 106 and 110 can comprise SAC405 (Sn/4.0Ag/0.5Cu), SAC105 (Sn/1.0Ag/0.5Cu), other SnCu based materials, or any other suitable materials. The top substrate 114 and the bottom substrate 122 can comprise organic material, Si interposer, or any other suitable material.

The buffer layer 108 can be formed over the bottom die 124 to absorb the stress between the top package 102 and the bottom package 104, caused by coefficient of thermal expansion (CTE) mismatch among various parts of the package assembly, e.g., the top substrate 114, the bottom die 124, and the solder bumps 106, among others. The buffer layer 108 can comprise polymer material with good thermal conductivity for heat dispassion, e.g., at least 1.0 W/° C.·m. The buffer layer 108 can be formed by spin coating on the bottom die 124. In some embodiments, the buffer layer 108 is formed on the bottom integrated circuit wafer of the bottom die 124 before die sawing. In some embodiments, the buffer layer 108 is formed under the bottom of the top package 102.

In one example, the top package 102 has a thickness of about 500 μm with a size of about 12×12 mm, the top substrate 114 has a thickness of about 175 μm (with a size of about 12×12 mm), the bottom substrate 122 has a thickness of about 250 μm (with a size of about 12×12 mm), the bottom die 124 and the underfill 128 has a combined thickness of about 190 μm, and the solder bumps (BGA balls) 106 and 110 has a thickness of about 190 μm with a size of about 240 μm. The buffer layer 108 has a dimension similar to the bottom die 124, and the thickness of the buffer layer 108 (e.g., about 80 μm) is identical to the gap between the bottom die 124 and the top package 102. The dimensions and sizes of the elements in the POP assembly 100 vary depending on the integrated circuit design.

The POP assembly 200 has a relatively low profile, better signal integrity from relatively low IR drop due to shorter electrical path compared to some other packaging methods. And the POP assembly 100 also has a higher thermal conductivity due to more heat transfer area provided by the buffer layer 108. Even though two packages (the top package 102 and the bottom package 104) in the POP assembly 100 are mounted on the PCB 112, different number of packages can be mounted on the PCB 112, and the buffer layer 108 can be used on multiple planes.

Figure 2:
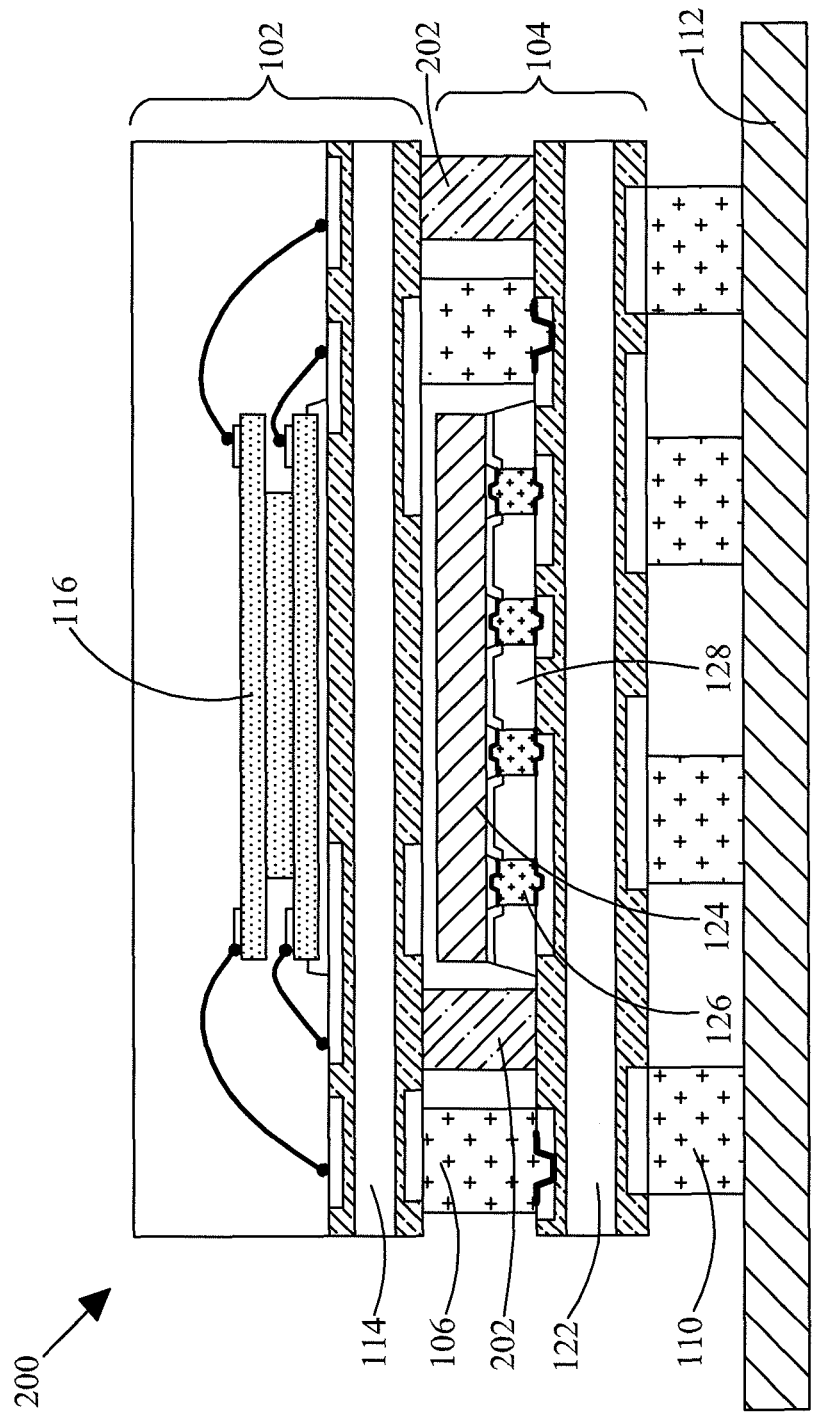
FIG. 2 is a schematic diagram of another exemplary POP assembly according to some embodiments.

FIG. 2 is a schematic diagram of another exemplary POP assembly according to some embodiments. The POP assembly 200 includes stub blocks 202 instead of the buffer layer 108 in FIG. 1. The stub blocks 202 can be placed on the bottom package 104 surface (the bottom substrate 122) through stencil control, which is similar to BGA ball drop in the same plane. The stub blocks 202 are positioned at locations where there is no solder bump 106.

The stub block 202 can comprise solder material identical to solder bumps 106 and 110 (BGA balls) or different material with higher melting temperature compared to solder bumps 106 and 110. In some embodiments, the stub blocks 202 have melting temp (Tm) that is 10° C. greater than the solder bumps 106 and 110. For example, the solder bumps 106 or 110 using SAC405 have its melting temperature at 217° C., while the stub blocks 202 using SAC105 have melting temperature at 230° C. and the stub blocks 202 using Sn-0.7Cu (Sn 99.3% and Cu 0.7%) have melting temperature at 227° C.

While the solder bumps 106 and 110 are designed for electrical signal connections (integrated circuit function), the stub blocks 202 are designed to reinforce the mechanical strength of the POP assembly 200 and help its thermal management. Also, the stub blocks 202 between the top package 102 and the top die 124 of the bottom package 104 help to control the CTE induced warpage in the POP assembly 200. In some embodiments, the stub blocks 202 have a width and length of about 100 μm-300 μm. The stub blocks 202 can have different shapes (such as circular, square, rectangular, etc.) and various dimensions depending on the locations and/or applications.

The POP assembly 200 has a higher thermal conductivity compared to conventional structures due to more heat transfer area provided by the stub blocks 202. Even though two packages (the top package 102 and the bottom package 104) in the POP assembly 200 are mounted on the PCB 112, different number of packages can be mounted on the PCB 112, and the stub blocks 202 can be used on multiple planes.

Figure 3:
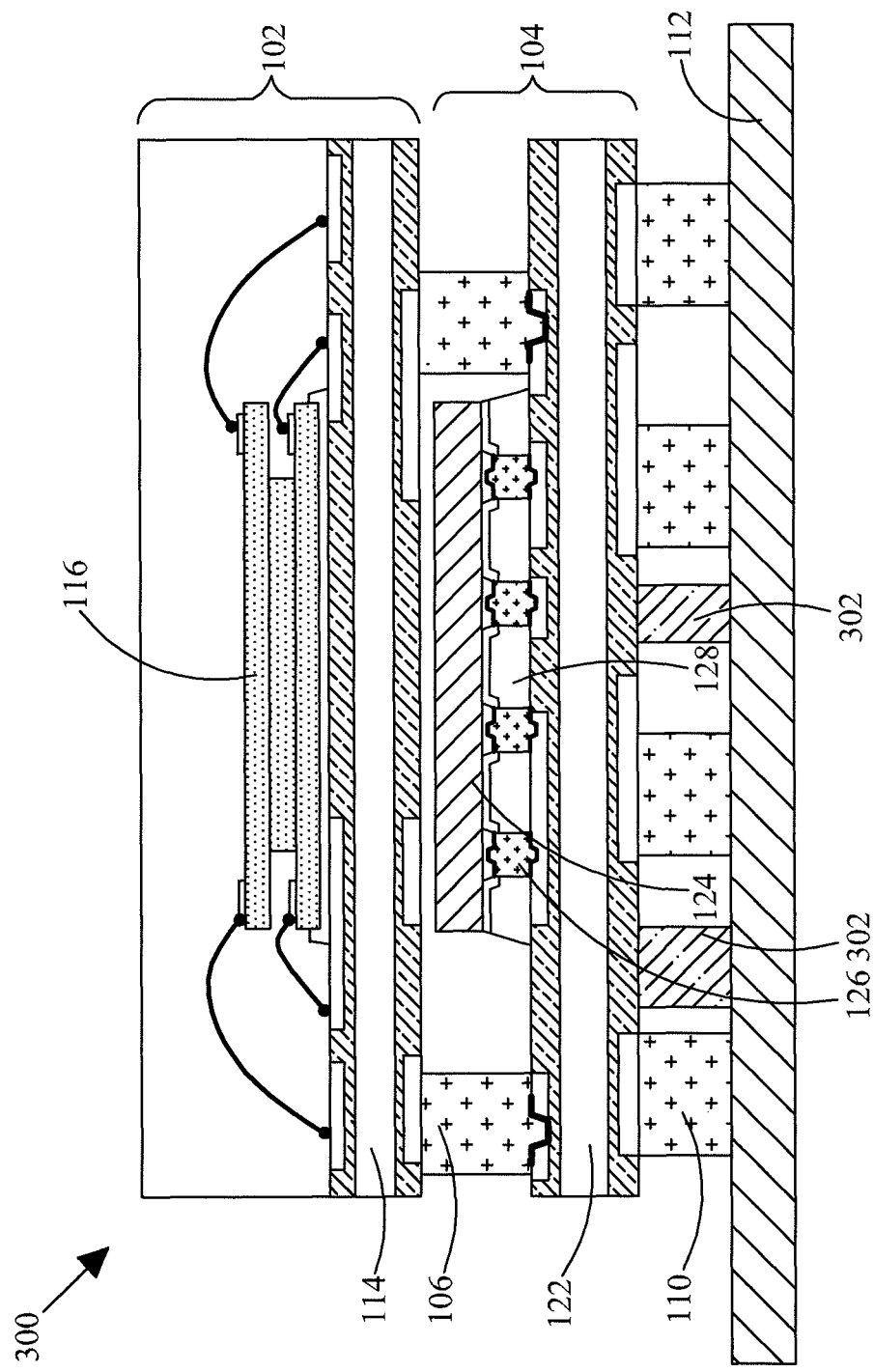
FIG. 3 is a schematic diagram of yet another exemplary POP assembly according to some embodiments.

FIG. 3 is a schematic diagram of yet another exemplary POP assembly according to some embodiments. The POP assembly 300 includes stub blocks 302 between the bottom package 104 and the PCB 112 instead of between the top package 102 and the bottom package 104 in FIG. 2. The stub blocks 302 can be placed on the PCB 112 surface through stencil control (at locations where there is no solder bump 110), which is similar to BGA ball drop in the same plane.

Figure 4:
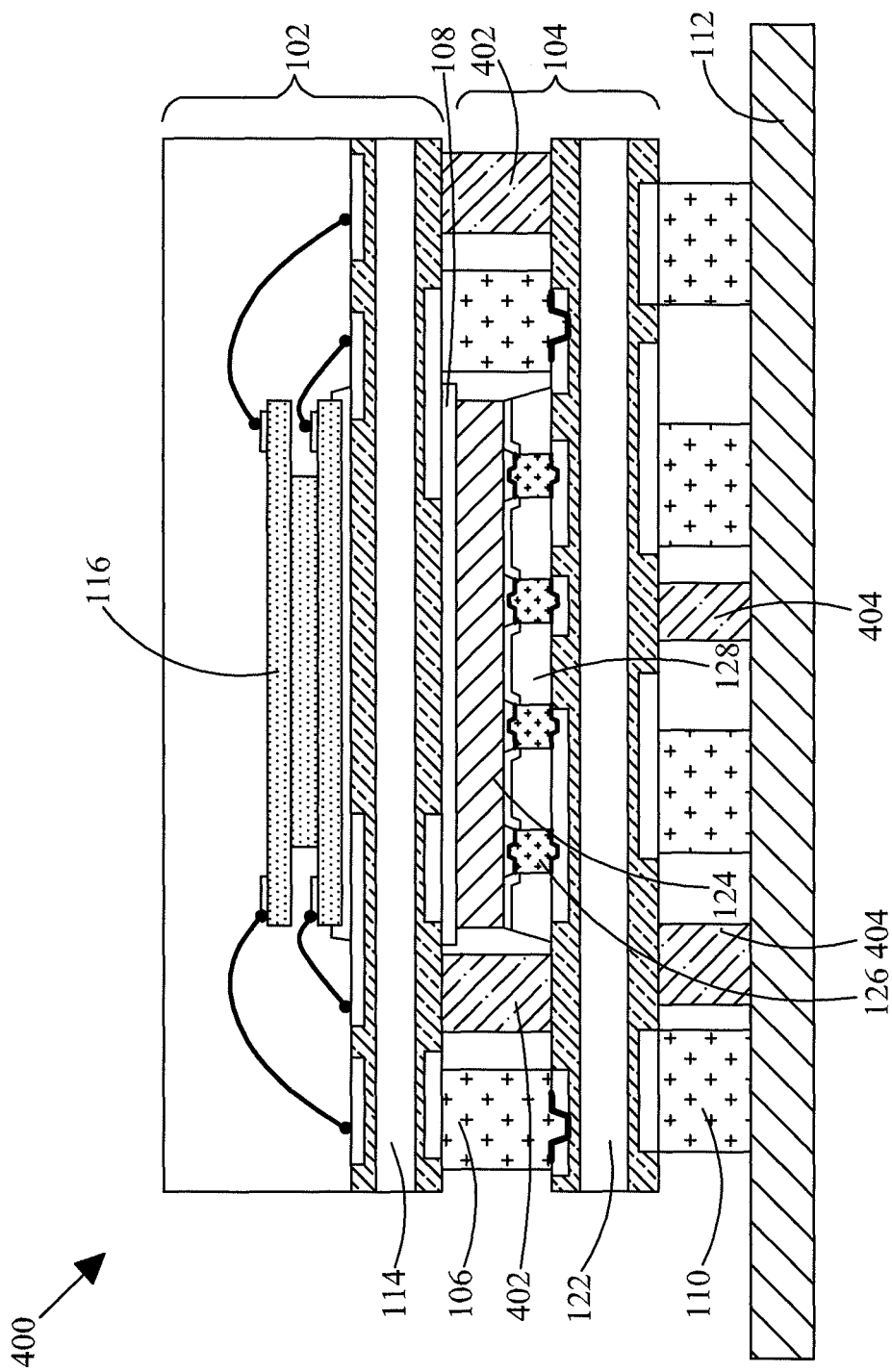
FIG. 4 is a schematic diagram of yet another exemplary POP assembly according to some embodiments.

FIG. 4 is a schematic diagram of yet another exemplary POP assembly according to some embodiments. The POP assembly 400 includes the buffer layer 108, stub blocks 402 between the top package 102 and the bottom package 104, and stub blocks 404 between the bottom package 104 and the PCB 112.

Figure 5:
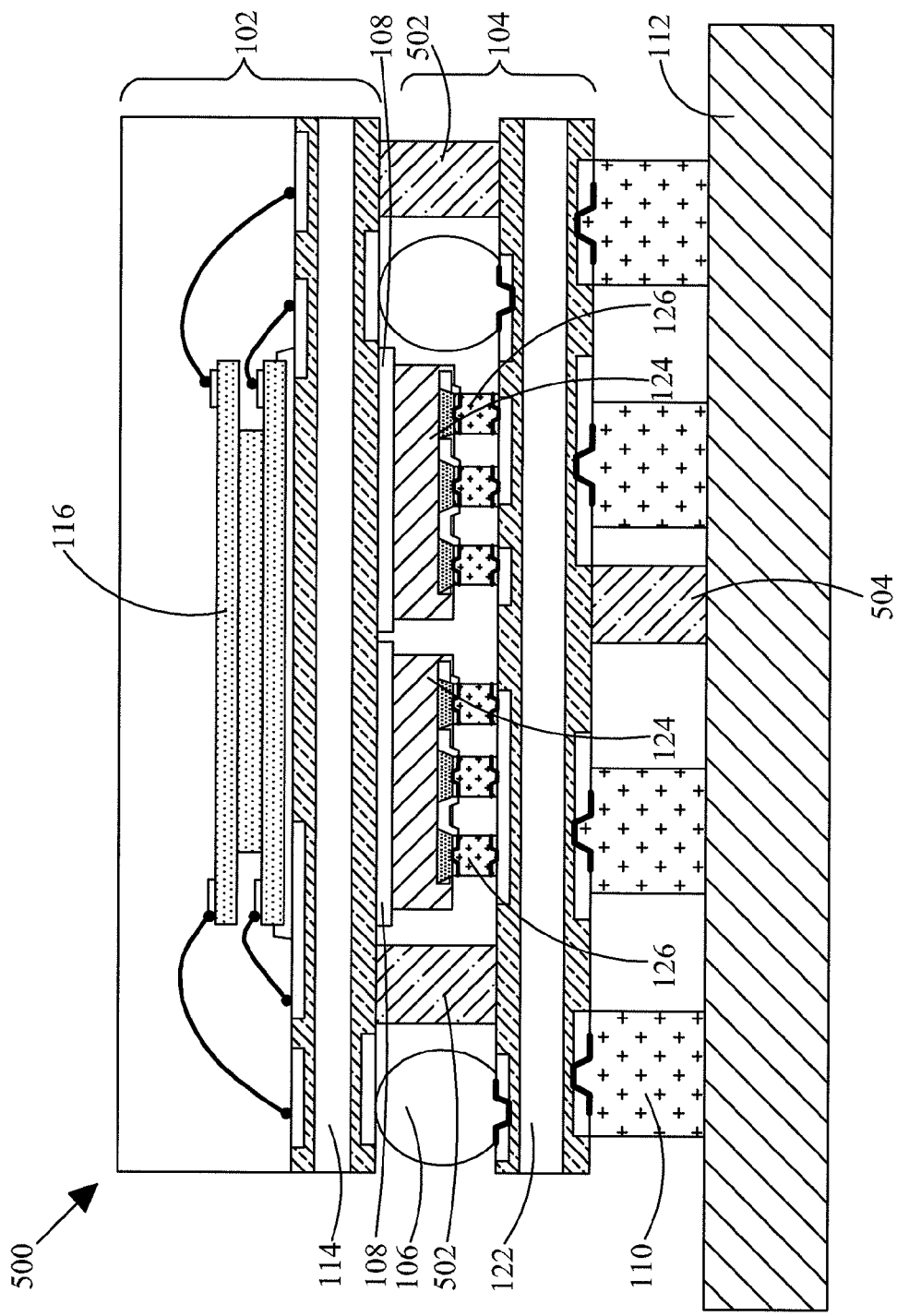
FIG. 5 is a schematic diagram of yet another exemplary POP assembly according to some embodiments.

FIG. 5 is a schematic diagram of yet another exemplary POP assembly according to some embodiments. The bottom package 104 in the POP assembly 500 includes multiple bottom dies 124 mounted on the bottom substrate 122 using micro bumps 126. The buffer layers 108, stub blocks 502 between the top package 102 and the bottom package 104, and stub blocks 504 between the bottom package 104 and the PCB 112 help to reinforce the mechanical strength of the POP assembly 500 and its thermal management. Also, the stub blocks 502 and 504 help to control the CTE induced warpage in the POP assembly 500.

Figure 6:
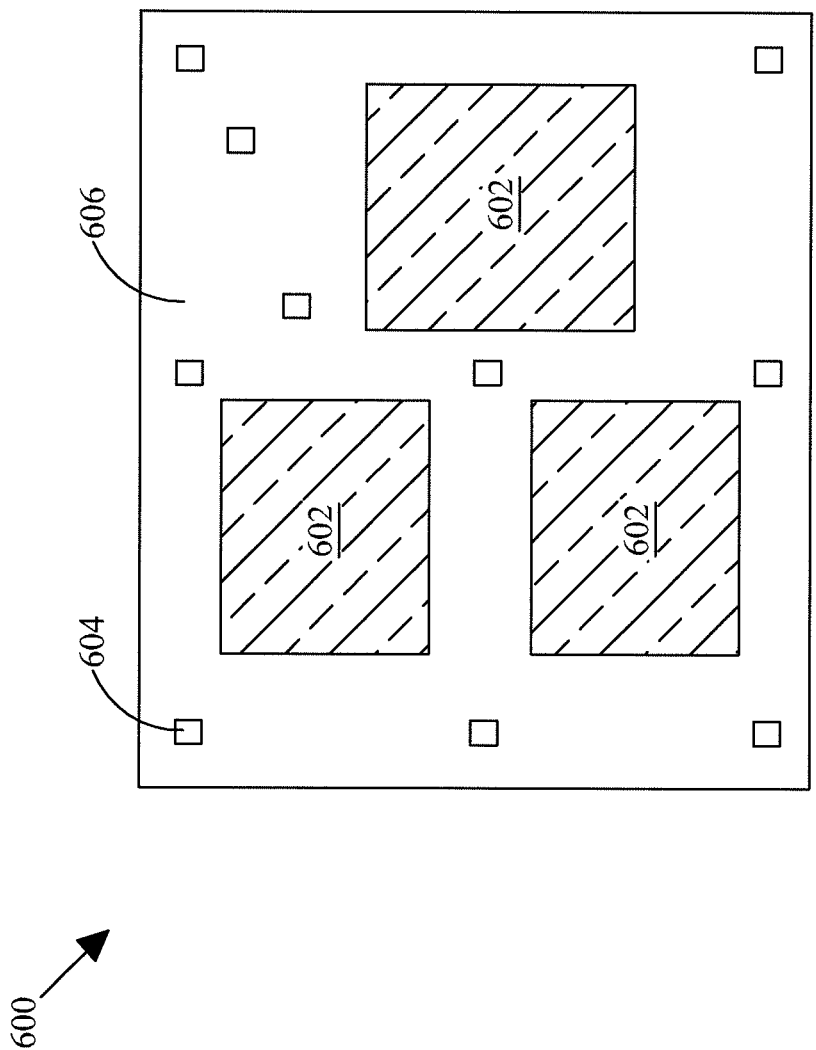
FIG. 6 is a layout of an exemplary POP assembly according to some embodiments.

FIG. 6 is a layout of an exemplary POP assembly according to some embodiments. The layout 600 includes multiple bottom dies 602 located throughout the layout area 606 and stub blocks 604 are positioned at various locations to reinforce the mechanical strength and help thermal management of the POP assembly layout 600. The stub blocks 604 can be placed in various positions depending on allowed design rules and other requirements of different applications.

FIG. 7 is a flowchart of a method of fabricating an exemplary POP assembly according to some embodiments. At step 702, solder bumps are formed under a first integrated circuit package. Solder bumps can be, for example, BGA solder balls. At step 704, at least one first support structure is formed under the first integrated circuit package or over a second integrated circuit package, wherein the at least one first support structure does not provide electrical signal connections among electrical components of the first integrated circuit package and the second integrated circuit package. The first support structure can be, for example, the buffer layer 108 in FIG. 1 or the stub blocks 202 in FIG. 2. At step 706, the first integrated circuit package is mounted over a second integrated circuit package, e.g., by BGA mount technique. At step 708, the second integrated circuit package over a printed circuit board, e.g., by surface mount technology (SMT).

In various embodiments, the at least one first support structure comprises a buffer layer formed over a die in the second integrated circuit package. In other embodiments, the buffer layer comprises polymer having thermal conductivity at least 1.0 W/° C.·m.

In various embodiments, the at least one first support structure comprises stub blocks disposed in locations where there is no solder bump. The stub blocks are formed at the same time as the solder bumps in some examples. At least one second support structure is formed under the second integrated circuit package or over the printed circuit board, wherein the at least one second support structure does not provide electrical signal connections. The second support structure can be, for example, the stub blocks 302 in FIG. 3. Details of the buffer layer 108 and the stub blocks 202 and 302 are as previously described above.

According to some embodiments, a package-on-package (POP) assembly includes a first integrated circuit package and a second integrated circuit package disposed under the first integrated circuit package. Solder bumps are disposed between the first integrated circuit package and the second integrated circuit package providing electrical signal connections between the first integrated circuit package and the second integrated circuit package. At least one support structure is disposed between the first integrated circuit package and the second integrated circuit package to facilitate thermal conduction between the first integrated circuit package and the second integrated circuit package without providing electrical signal connections.

According to some embodiments, a method of fabricating a package-on-package (POP) assembly includes forming solder bumps under a first integrated circuit package. At least one support structure is formed under the first integrated circuit package or over the second integrated circuit package, wherein the at least one support structure does not provide electrical signal connections. The first integrated circuit package is mounted over a second integrated circuit package.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit package assembly, comprising:
a first integrated circuit package;
a second integrated circuit package disposed under the first integrated circuit package;
solder bumps disposed between a first surface of the first integrated circuit package and a second surface of the second integrated package, the solder bumps providing electrical signal connections between the first integrated circuit package and the second integrated circuit package; and
at least two first support structures disposed between and in direct contact with the first surface of the first integrated circuit package and the second surface of the second integrated circuit package to facilitate thermal conduction between the first integrated circuit package and the second integrated circuit package without providing electrical signal connections.

2. The integrated circuit package assembly of claim 1, wherein the first integrated circuit package comprises a first integrated circuit die mounted on a first substrate, the second integrated circuit package comprises a second integrated circuit die mounted on a second substrate, and the integrated circuit package assembly further comprises a buffer layer disposed between the first substrate and the second integrated circuit die.

3. The integrated circuit package assembly of claim 2, wherein the buffer layer comprises polymer having thermal conductivity at least 1.0 W/° C.·m.

4. The integrated circuit package assembly of claim 2, wherein the first substrate and the second substrate comprise an organic material or silicon.

5. The integrated circuit package assembly of claim 2, wherein the second substrate comprises an interposer.

6. The integrated circuit package assembly of claim 1, wherein the at least two first support structures comprise stub blocks disposed in locations where there is no solder bump.

7. The integrated circuit package assembly of claim 6, wherein the stub blocks comprise the same material as the solder bumps.

8. The integrated circuit package assembly of claim 6, wherein the stub blocks comprise a material having a higher melting temperature than the solder bumps.

9. The integrated circuit package assembly of claim 6, wherein the stub blocks have a melting temperature of at least 227° C.

10. The integrated circuit package assembly of claim 1, further comprising pads providing electrical contact surfaces for solder bumps, wherein the pads are disposed on the first surface of the first integrated circuit package facing the solder bumps and on the second surface of the second integrated circuit package facing the solder bumps.

11. The integrated circuit package assembly of claim 1, further comprising a printed circuit board disposed below the second integrated circuit package electrically connected to the second integrated circuit package by solder bumps disposed between the second integrated circuit package and the printed circuit board.

12. The integrated circuit package assembly of claim 11, further comprising at least one second support structure disposed between the second integrated circuit package and the printed circuit board to facilitate thermal conduction between the second integrated circuit package and the printed circuit board without providing electrical signal connections.

13. An integrated circuit package assembly, comprising:
a first integrated circuit package including a first integrated circuit die mounted on a first substrate;
a second integrated circuit package including a second integrated circuit die mounted on a second substrate, the second integrated circuit package being disposed under the first integrated circuit package;
solder bumps disposed between the first integrated circuit package and the second integrated circuit package providing electrical signal connections between the first integrated circuit package and the second integrated circuit package;
a buffer layer disposed between the first substrate and the second integrated circuit die to facilitate thermal conduction between the first integrated circuit package and the second integrated circuit package; and
stub blocks disposed between and in direct contact with the first integrated circuit package and the second integrated circuit package to facilitate thermal conduction between the first integrated circuit package and the second integrated circuit package without providing electrical signal connections.

14. The integrated circuit package assembly of claim 13, wherein the stub blocks comprise the same material as the solder bumps.

15. The integrated circuit package assembly of claim 13, wherein the stub blocks comprise a material having a higher melting temperature than the solder bumps.

16. The integrated circuit package assembly of claim 13, wherein the stub blocks have a melting temperature of at least 227° C.

17. The integrated circuit package assembly of claim 13, further comprising a printed circuit board below the second integrated circuit package, the printed circuit board being electrically connected to the second integrated circuit package by another solder bumps between the second integrated circuit package and the printed circuit board.

18. An integrated circuit package assembly, comprising:
a first integrated circuit package comprising a substrate, the substrate of the first integrated circuit package comprising a lower surface, and the lower surface comprising a first portion having one or more pads and a second portion having no pad;

a second integrated circuit package comprising a substrate, the substrate of the second integrated circuit package comprising an upper surface, and the upper surface comprising a first portion having one or more pads and a second portion having no pad;

one or more solder bumps between the first integrated circuit package and the second integrated circuit package, one of the one or more solder bumps connecting one of the one or more pads of the first integrated circuit package and a corresponding one or the one or more pads of the second integrated circuit package; and at least two support structures between and in direct contact with the lower surface of the first integrated circuit package and the upper surface of the second integrated circuit package, the at least two support structures connecting the second portion of the lower surface of the first integrated circuit package and the second portion of the upper surface of the second integrated circuit package.

19. The integrated circuit package assembly of claim 18, wherein the at least two support structures comprise the same material as the one or more solder bumps.

20. The integrated circuit package assembly of claim 19, wherein the at least two support structures comprise a material having a higher melting temperature than the one or more solder bumps.

* * * * *